United States Patent [19]

Kesler et al.

[11] Patent Number: 5,121,004
[45] Date of Patent: Jun. 9, 1992

[54] INPUT BUFFER WITH TEMPERATURE COMPENSATED HYSTERESIS AND THRESHOLDS, INCLUDING NEGATIVE INPUT VOLTAGE PROTECTION

[75] Inventors: Scott B. Kesler; Mark W. Gose, both of Kokomo, Ind.

[73] Assignee: Delco Electronics Corporation, Kokomo, Ind.

[21] Appl. No.: 742,814

[22] Filed: Aug. 9, 1991

[51] Int. Cl.$^5$ .......................................... H03K 19/00
[52] U.S. Cl. .................................. 307/454; 307/443; 307/310
[58] Field of Search ............... 307/9.1, 296.6, 310, 307/443, 454, 475

[56] References Cited

U.S. PATENT DOCUMENTS

| | | | |
|---|---|---|---|
| 3,166,678 | 1/1965 | Fleshman | 307/88.5 |
| 3,346,846 | 10/1967 | Ferguson et al. | 340/172 |
| 3,428,826 | 2/1969 | Berry | 307/235 |
| 3,428,827 | 2/1969 | Berry | 307/235 |
| 3,487,233 | 12/1969 | Reap | 307/235 |
| 3,546,481 | 12/1970 | Talley | 307/235 |
| 3,700,921 | 10/1972 | Gay | 307/235 |
| 3,851,189 | 11/1974 | Moyer | 307/279 |
| 4,104,593 | 8/1978 | Oril | 325/392 |
| 4,435,658 | 3/1984 | Murray et al. | 307/530 |
| 4,642,488 | 2/1987 | Parker | 307/475 |
| 4,683,416 | 7/1987 | Bynum | 307/310 X |
| 4,710,793 | 12/1987 | Gray | 357/44 |
| 5,034,626 | 7/1991 | Pirez et al. | 307/310 X |

*Primary Examiner*—Robert J. Pascal
*Attorney, Agent, or Firm*—Anthony Luke Simon

[57] ABSTRACT

An input buffer apparatus receives data from a single ended transmission line and provides an output signal in one or two states in response to the state of the signal on the input. The apparatus has hysteresis with temperature stable upper and lower thresholds. Temperature stability is achieved by providing first and second temperature dependent reference currents, one with a positive temperature coefficient and one with a negative temperature coefficient and by adjusting the temperature coefficients of the first and second reference currents so that the sum effect of all of the temperature coefficients of the system is substantially zero.

4 Claims, 2 Drawing Sheets

INPUT BUFFER WITH TEMPERATURE COMPENSATED HYSTERESIS AND THRESHOLDS, INCLUDING NEGATIVE INPUT VOLTAGE PROTECTION

This invention pertains to circuitry for receiving data from a single ended transmission line and more particularly to such circuitry having hysteresis and thresholds substantially independent of temperature, and negative input voltage protection.

BACKGROUND OF THE INVENTION

When a temperature independent voltage reference is already available in an integrated circuit, temperature independent input switching thresholds are typically provided by a circuit configured as a differential transistor pair. One side of the differential transistor pair serves as the input, the other side is tied to the temperature independent voltage reference.

When a stable voltage reference is not already required for some other integrated circuit function, and supply voltage variations preclude using the supply voltage as a temperature stable voltage reference, the addition of a temperature stable voltage reference adds considerable cost to the integrated circuit. This added cost results from both the complexity of temperature independent voltage supplies and the silicon area required to integrate such reference voltage supplies into the circuit. One typical element of temperature stable voltage supplies is a feedback compensation capacitor. This element itself requires a large amount of additional silicon area on the integrated circuit, or may even be an external component.

SUMMARY OF THE PRESENT INVENTION

This invention is designed for implementation in an integrated circuit and provides an input buffer for receiving data from a single ended transmission line. The circuit of this invention uses only a single positive voltage supply and provides temperature insensitive high and low thresholds with an adjustable hysteresis without the need for a temperature stable voltage reference. The input of the circuit can withstand negative voltages of tens of volts, the limiting factor being the base to emitter breakdown characteristics of the input PNP transistor. The above characteristics of this invention make it suitable for implementation into automotive applications.

This invention is best used on an integrated circuit where there is no other need for a voltage reference circuit and where supply voltage variations prevent using the supply voltage as a reference for the input thresholds. The negative input voltage protection of this circuit prevents the loss of low state data integrity and prevents the circuit from sourcing current onto a transmission line. In the event that the input signal is floated, the circuit of this invention goes to a low logic state.

This invention uses a reference current generator which produces a first reference current with a positive temperature coefficient. In many cases, such a positive temperature coefficient current generator is already on the integrated circuit for other functions. The positive temperature coefficient reference current, along with another simply generated negative temperature coefficient reference current are combined in a calculated ratio such that the net sum current has a temperature coefficient designed to offset other internal input buffer temperature dependent parameters. Any means of generating the positive and negative temperature coefficient currents is acceptable. The end result of the circuitry of this invention is an input buffer with temperature independent high and low input thresholds.

Structurally, this invention comprises first and second temperature dependent current generators generating first and second temperature dependent currents, the first temperature dependent current generator having a positive temperature coefficient and the second temperature dependent current generator having a negative temperature coefficient. An input circuit includes first and second transistors connected such that when the emitter of the first transistor receives a voltage greater than a high threshold, the second transistor turns off and such that when the emitter of the first transistor receives a voltage less than a low threshold, the second transistor turns on. A threshold circuit selectively channels portions of the first and second temperature dependent currents through a resistor in response to the state of the second transistor, the high and low thresholds being dependent upon the amount of current through the resistor. An output circuit switches between first and second output signal levels. The output circuit switching to the first output signal level when voltage below the low threshold is applied to the emitter of the input transistor and switching to the second output signal level when voltage above the high threshold is applied to the emitter of the input transistor.

DETAILED DESCRIPTION OF THE INVENTION

Figure 1:
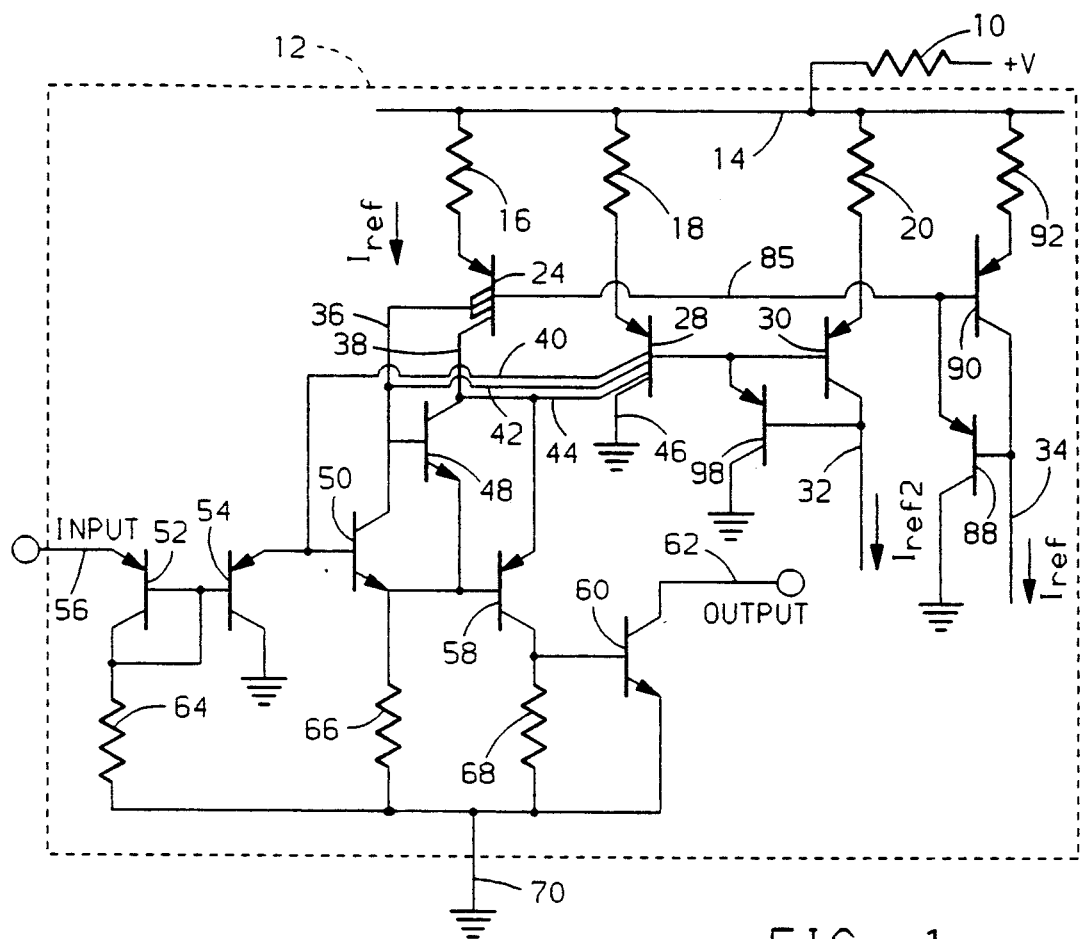
FIG. 1 is a circuit drawing of the circuit of this invention.

Referring to FIG. 1, the circuit of this invention is preferably an integrated circuit and is shown within the box 12. The integrated circuitry within box 12 has a voltage supply line 14 receiving power through external resistor 10 from voltage supply +V, such as a vehicle battery. Typically, the voltage supply line 14 is attached to a voltage clamp of a type easily implemented by those skilled in the art. The circuit of this invention is an input buffer which receives an input signal on line 56 from a serial data line and supplies an output on line 62 in response to the state of the input signal.

For the circuit of this invention to be temperature stable, two current sources need to be implemented with this invention. The first current source provides a first temperature dependent current, $I_{ref}$, with a positive temperature coefficient on line 34 and the second current source provides a second temperature dependent current, $I_{ref2}$, with a negative temperature coefficient on line 32. A more detailed description of two example current sources is set forth below with reference to FIG. 2, along with a description of the calibration of the current sources so that the input thresholds of the circuit are temperature independent.

With resistor 92 equal in impedance to resistor 16 and the emitter area of transistor 90 equal to the emitter area of transistor 24, which has its base connected to transistor 90 through line 85, reference current $I_{ref}$ is mirrored through transistor 24. With the four collectors of transistor 24 being equal, each receives one quarter of the current $I_{ref}$, through transistor 24. Likewise, with resistor 20 having an impedance equal to that of resistor 18, and transistor 30 having an emitter area equal to that of transistor 28, reference current $I_{ref2}$ is mirrored through transistor 28. With the four collectors of transistor 28 being substantially equal, each receives one quarter of the current $I_{ref2}$ through transistor 28.

In operation, the circuit of FIG. 1 receives input signals on line 56 to the input circuit comprising transistors 52 and 54. High and low level input threshold voltages are determined by the sum of the voltage across resistor 66 and base to emitter voltages ($V_{be}$) of transistors 52, 54 and 50. Hysteresis is achieved by switching the amount of current forced through resistor 66, and therefore the voltage across resistor 66.

When the input on line 56 is high (higher than the high threshold voltage, $V_{th}$), transistor 52 is conducting current, switching transistor 54 off, which allows transistor 50 to be held on by the current coming through line 40 from one of the quarter collectors of transistor 28. Transistors 50 and 48 comprise the threshold circuit. When transistor 50 is conducting, transistor 48 is held off. With transistor 48 held off, the current from one of the quarter collectors of transistor 24, through line 38 sums with the current from one of the quarter collectors of transistor 28, at line 44, and flows through the emitter of transistor 58. Transistors 58 and 60 comprise the output circuit. The current flowing through transistor 58 flows through resistor 68, increasing the $V_{be}$ of output transistor 60, turning on transistor 60 and providing a first state output signal on line 62.

When the input on line 56 is in a low state (lower than the low threshold voltage, $V_{tl}$), the voltage at the base of transistor 54 is low enough that transistor 54 turns on. When transistor 54 is on, it pulls all of the current from line 40 away from the base of transistor 50, shutting off transistor 50. When transistor 50 is off, transistor 48 is forced into a conductive state of saturation from the current supplied by the three quarter collectors of transistor 24 connected to line 36 and the current from the quarter collector of transistor 28 connected to line 42. When transistor 48 is saturated, transistor 58 is switched off, in turn switching off output transistor 60 and providing a second state output signal on line 62. In the event the input line 56 is left open, resistor 64 biases transistor 54 conductive, holding the output on line 62 in the second state.

Figure 3:
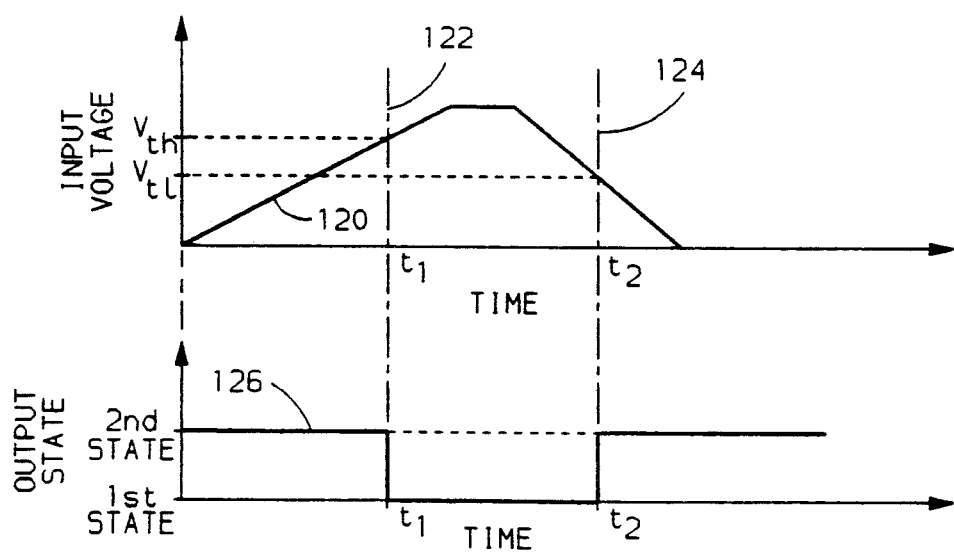
FIG. 3 is a diagram showing the input signal in relation to the high and low thresholds, and the output signal.

FIG. 3 shows an example input signal 120. When the output signal 126 (corresponding to the signal on line 62) is in the second state, and the input signal is below $V_{th}$, or open, the output signal 126 remains in the second state. When the input signal 120 reaches the high threshold, $V_{th}$, e.g., at time $t_1$ (line 122), the output signal 126 switches to the first state. The output signal 126 remains in the first state until the input signal 120 falls below the low threshold, $V_{tl}$, e.g., at time $t_2$ (line 124), or line 56 becomes open, at which point the output signal 126 on line 62 reverts back to the second state.

The NP base-emitter junction of transistor 52 serves to protect the circuit against negative input voltages. This protection against negative input voltages prevents adverse effects to the circuit as long as the voltage across the base and emitter of transistor 52 is not greater than the breakdown voltage of that junction.

Hysteresis in the input circuit is achieved by toggling the current through resistor 66 as transistor 48 switches on and off. When transistor 48 is off, resistor 66 receives ¾ of the current $I_{ref}$ and ¼ of the current $I_{ref2}$, and sets the low threshold, $V_{tl}$. When transistor 48 is on, resistor 66 receives more current, i.e., all of the current $I_{ref}$ and ½ of the current $I_{ref2}$, and sets the high threshold, $V_{th}$. While the base drive current of transistor 50 is also a component of the current through resistor 66 when the input on line 56 is at a high level, most of the current is diverted by transistor 54 at the point where switching occurs, and therefore is a negligible factor in determining the actual switching voltage. In this state the low threshold, $V_{tl}$, is set equal to:

$$V_{tl} = V_{R66} + V_{be50} - V_{be54} + V_{be52}, \quad (1)$$

where $V_{be50}$ is the $V_{be}$ voltage of transistor 50, $V_{be54}$ is the $V_{be}$ voltage of transistor 54, $V_{be52}$ is the $V_{be}$ voltage of transistor 52, and where $V_{R66}$ is the voltage across resistor 66, equal to:

$$V_{R66} = R_{66}(0.75 I_{ref} + 0.25 I_{ref2}), \quad (2)$$

where $R_{66}$ is the resistance of resistor 66.

The $V_{be}$'s of transistors 52, 54 and 50 depend upon the transistor collector currents, the temperature, the transistor size, and the silicon processing. The transistor size and silicon processing are known from the fabrication of the integrated circuit. The temperature dependence can be easily determined by one skilled in the art from simple experimentation. The collector currents are all known: the collector current of transistor 52 is the input current; the collector current of transistor 54 is $0.25 I_{ref2}$; and the collector current of transistor 50 is $0.75 I_{ref} + 0.25 I_{ref2}$. Since all of these parameters are known, the $V_{be}$'s of transistors 52, 54 and 50 are also known.

When the input is at a low level, the circuitry has toggled to the high level threshold, $V_{th}$, state. In this state, with transistor 50 off and transistor 48 on, in a state of saturation, the current through resistor 66 is the sum of all of the collector current of transistor 24, via line 36 through the base of transistor 48 and via line 38, and half of the collector current of transistor 28, via line 42, through the base of transistor 48 and via line 44. At the switching point, transistor 54 is drawing most of the quarter collector current of transistor 28 in line 40, therefore this current does not contribute to the threshold voltage calculation, except in inverse proportion to the beta of transistor 50., which is so large, this portion of the current is negligible. The high level threshold, $V_{th}$, is defined by:

$$V_{th} = V_{R66} + V_{be50} - V_{be54} + V_{be52}, \quad (3)$$

where $$V_{R66} = R_{66}(I_{ref} + 0.5 I_{ref2}). \quad (4)$$

The hysteresis shift is determined by the value of resistor 66 multiplied by the difference in current through resistor 66 in each of the two states. This determined hysteresis shift, $V_{hys}$, is defined:

$$V_{hys} = 0.25 R_{66}(I_{ref} + I_{ref2}). \quad (5)$$

Figure 2:
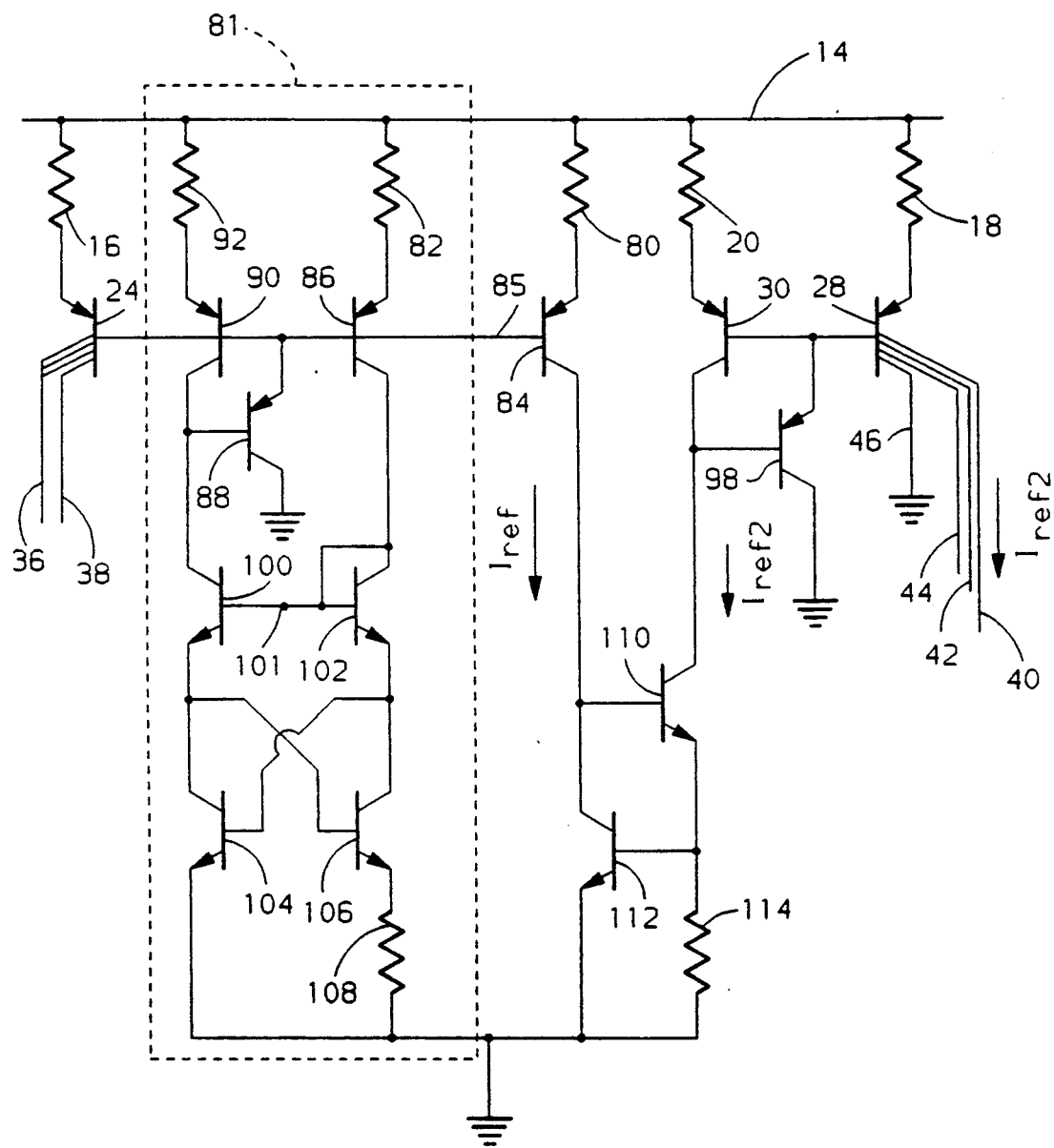
FIG. 2 is a drawing of a circuit for generating first and second reference currents for use with the circuit of this invention illustrated in FIG. 1.

Referring now to FIG. 2, the preferred current generators for generating current $I_{ref}$ having a positive temperature coefficient and current $I_{ref2}$ having a negative temperature coefficient are shown. The portion of the circuit shown in box 81 is a standard "delta $V_{be}$" current generator. The current generated is controlled by transistors 100, 102, 104 and 106 and resistor 108. In the implementation shown, transistors 100 and 106 each have three times the emitter area of transistors 102 and 104, which are identical. Because of the larger emitter areas of transistors 100 and 106, the $V_{be}$ voltage drop of those transistors is smaller than the $V_{be}$ voltage drop of transistors 102 and 104. Using node 101 as a reference, the sum of the $V_{be}$ voltage of transistor 100 with the $V_{be}$ voltage of transistor 106 and the voltage drop across resistor 108 is equal to the sum of the $V_{be}$ voltage drop of transistor 102 and the $V_{be}$ voltage drop of transistor 104.

From the above, it can be shown that the positive coefficient temperature dependent current $I_{ref}$ through resistor 108 can be defined as:

$$I_{ref} = (V_t \ln(9))/R_{108}, \tag{6}$$

where $V_t$ is the thermal voltage defined by kT/q, where k is the Boltzman's constant, T is the temperature in degrees Kelvin, q is the electronic charge, and $R_{108}$ is the resistance of resistor 108. Because the circuitry is implemented in a manner in which $V_t$ increases with temperature more rapidly than the value of resistor 108, $I_{ref}$ has a positive temperature coefficient.

With resistors 16, 82, and 92 having substantially equal values, and transistors 24, 86 and 90 having substantially equal emitter areas, the circuitry shown mirrors current $I_{ref}$ through transistor 24, to the four quarter collectors of transistor 24. With resistor 92 also being equal to resistor 80 and transistor 90 being equivalent to transistor 84, the current $I_{ref}$ is also mirrored through transistor 84, to the circuit that generates $I_{ref2}$, the temperature dependent current with a negative coefficient. Transistor 88 is a PNP substrate transistor.

To generate the negative coefficient temperature dependent current, $I_{ref2}$, $I_{ref}$ forward biases transistor 110, which in turn forward biases transistor 112. Resistor 114, connected between the base and emitter of transistor 112, has a current proportional to the $V_{be}$ of transistor 112 and inversely proportional to the value of resistor 114. Since the $V_{be}$ of transistor 112 has a negative temperature coefficient and the value of resistor 114 has a positive temperature coefficient, the current through resistor 114, $I_{ref2}$, has a negative temperature coefficient.

With resistors 20 and 18 having substantially equal resistances, transistors 30 and 28, also substantially identical to one another, are set up so that current $I_{ref2}$ is mirrored through transistor 28, with one quarter of $I_{ref2}$ flowing through each of the quarter collectors of transistor 28. Transistor 98 is a PNP substrate transistor.

To achieve an input buffer that is substantially independent of temperature, the temperature coefficients of $I_{ref}$ and $I_{ref2}$ must be set up so that they offset other temperature coefficients in the circuit. The transistor $V_{be}$ voltages decrease with increasing temperature, showing a negative temperature coefficient. The resistance of resistor 66 increases with temperature, showing a positive temperature coefficient.

When balancing the temperature coefficients, the temperature coefficient of $V_{be}$ of transistor 52 can be assumed to be the same as the temperature coefficient of $V_{be}$ of transistor 54. These temperature coefficients then offset each other resulting in no net change in the thresholds, $V_{tl}$ and $V_{th}$. This simplification allows the temperature shift calculations to include only the $V_{be}$ of transistor 50, the resistance of resistor 66, and the reference currents $I_{ref}$ and $I_{ref2}$.

At the high level threshold, assuming $V_{be52}$ equals $V_{be54}$:

$$V_{th} = R_{66}(I_{ref} + 0.5I_{ref2}) + V_{be50}. \tag{7}$$

where $I_{ref}$ is as defined above in equation (6) and where:

$$I_{ref2} = V_{be112}/R_{114}, \tag{8}$$

where $V_{be112}$ is the $V_{be}$ of transistor 112 and $R_{114}$ is the resistance of resistor 114. At the low level threshold:

$$V_{tl} = R_{66}(0.75I_{ref} + 0.25I_{ref2}) + V_{be50}. \tag{9}$$

From equations (6), (7), (8), and (9):

$$V_{th} = R_{66}V_t\ln(9)/R_{108} + R_{66}V_{be112}/(2R_{114}) + V_{be50}, \tag{10}$$

$$V_{tl} = 3R_{66}V_t\ln(9)/(4R_{108}) + R_{66}V_{be112}/(4R_{114}) + V_{be50}, \tag{11}$$

Since transistor 112 and transistor 50 both have the same emitter areas, they have very similar $V_{be}$ temperature coefficients. Thus equations (10) and (11) can be further simplified:

$$V_{th} = R_{66}V_t\ln(9)/R_{108} + V_{be}(1 + R_{66}/(2R_{114})), \tag{12}$$

where $$V_{be} = V_{be112} = V_{be50},$$

and $$V_{tl} = 3R_{66}V_t\ln(9)/(4R_{108}) + V_{be}(1 + R_{66}/(4R_{114})). \tag{13}$$

For $V_{th}$ and $V_{tl}$ to have no variation with temperature, the variations with temperature of the two terms above must be equal and of opposite sign. Since the resistor terms all appear as ratios, their temperature coefficients cancel and are not temperature dependent factors. The resistor ratios are multiplying factors for the temperature coefficients of the other factors. It is known that the thermal voltage $V_t$ varies by approximately 87 uV per degree C. and the temperature coefficient of $V_{be}$ is approximately $-1.8$ mV per degree C. (note: the temperature coefficient of $V_{be}$ varies with collector current, process parameters and transistor size).

To achieve a substantially zero temperature coefficient for $V_{th}$ and Vtl, the following expressions must be solved:

$$0.86u V R_{66}\ln(9)/R_{108} = 1.8\text{mV}(1 + R_{66}/(2R_{114})),$$
and \hfill (14)

$$0.86u V 3R_{66}\ln(9)/(4R_{108}) = 1.8\text{mV}(1 + R_{66}/(4R_{114})). \tag{15}$$

Equations (14) and (15) must be solved simultaneously and the solution process may be iterative in nature. This solution process can be easily accomplished by one skilled in the art.

Although the above solution may be preferred by some due to its simplicity, a more precise solution for the values of resistors 66, 108 and 114 can be found by including the temperature variation of the reference currents in each of the transistor collectors. Transistor beta terms and other second and third order effects known to those skilled in the art may also be included. A solution using all of these factors may be easily accomplished by one skilled in the art through use of a computer simulation program, in which all of the above factors are taken into consideration.

Since the hysteresis is a result of equal changes in the $I_{ref}$ and the $I_{ref2}$ components of the threshold equations, the relative ratio of current through $R_{66}$ between high and low threshold settings does not change. Therefore the relation between $V_{tl}$ and $V_{th}$ does not change with temperature. This provides the substantially temperature insensitive threshold and hysteresis features of the invention.

A successful implementation of this invention was achieved using the following component values: resistor $16=$ resistor $80=$ resistor $82=$ resistor $92=500$ Ω; resistor $20=$ resistor $18=1.25$ kΩ; resistor $108=340$ Ω; resistor $114=3800$ Ω; resistor $64=10$ kΩ; resistor $66=5500$ Ω; and resistor $68=20$ kΩ. With the above values, $V_{th}$ equal to 2.00 volts and $V_{tl}$ equal to 1.60 volts were achieved. Over a tested temperature range of $-40$ degrees C. to 165 degrees C., the statistical mean for $V_{th}$ of the above circuit shifted by only 41 mV.

Those skilled in the art will easily be able to alter the above component values to achieve the desired input buffer characteristics for a specific design implementation. Moreover, various other improvements and modifications to the above example implementation of this invention may occur to those skilled in the art and will fall within the scope of this invention as set forth below.

The embodiments of the invention in which an exclusive property or privilege is claimed are defined as follows:

1. An input buffer circuit for receiving data from a single ended transmission line and suitable for integration and having various components with temperature coefficients, comprising:
   a first temperature dependent current generator generating a first temperature dependent current having a positive temperature coefficient;
   a second temperature dependent current generator generating a second temperature dependent current having a negative temperature coefficient, the positive and negative temperature coefficients of the first and second temperature dependent currents offsetting the temperature coefficients of the various components of the input buffer circuit;
   an input circuit including first and second transistors connected such that when an emitter of the first transistor receives a voltage greater than a high threshold, the second transistor turns off and such that when the emitter of the first transistor receives a voltage less than a low threshold, the second transistor turns on;
   a threshold circuit coupled to the input circuit for selectively channeling portions of the first and second temperature dependent currents through a resistor in response to the state of the second transistor, the high and low thresholds being dependent upon the amount of current through the resistor; and
   an output circuit coupled to the threshold circuit for switching between first and second output signal levels in response to the threshold circuit such that the output circuit switches to the first output signal level when voltage above the high threshold is applied to the emitter of the first transistor and switches to the second output signal level when voltage below the low threshold is applied to the emitter of the first transistor, whereby the input buffer circuit has hysteresis, maintains substantially constant high and low thresholds independent of temperature and without requiring a temperature stable voltage supply, and has protection against negative input voltages.

2. The input buffer circuit of claim 1 wherein the amount of current through the resistor is substantially equal to a sum of all of the first temperature dependent current and half of the second temperature dependent current when the second transistor is turned off and wherein the amount of current through the resistor is substantially equal to a sum of three quarters of the first temperature dependent current and one quarter of the second temperature dependent current when the second transistor is turned on.

3. The input buffer circuit of claim 1, wherein the threshold circuit includes third and fourth transistors coupled to each other and to first and second four collector transistors, the first four collector transistor providing one quarter of the first temperature dependent current in each of its four collectors and the second four collector transistor providing one quarter of the second temperature dependent current in each of its four collectors, the transistors connected such that when the second transistor is in a conductive state, the fourth transistor transmits all of the first temperature dependent current from the first four collector transistor and a half of the second temperature dependent current from the second four collector transistor through the resistor, the transistors also connected such that when the second transistor is in a nonconductive state, the third transistor transmits three quarters of the first temperature dependent current from the first four collector transistor and one quarter of the second temperature dependent current from the second four collector transistor through the resistor.

4. An input buffer circuit for receiving data from a single ended transmission line and suitable for integration and having various components with temperature coefficients, comprising:
   means for generating a first temperature dependent current having a positive temperature coefficient;
   means for generating a second temperature dependent current having a negative temperature coefficient, the positive and negative temperature coefficients of the first and second temperature dependent currents offsetting the temperature coefficients of the various components of the input buffer circuit;
   input means for receiving an input signal including first and second transistors connected such that when an emitter of the first transistor receives a voltage greater than a high threshold, the second transistor turns off and such that when the emitter of the first transistor receives a voltage less than a low threshold, the second transistor turns on;
   threshold means, coupled to the input means, for selectively channeling portions of the first and second temperature dependent currents through a resistor in response to the state of the second transistor, the high and low thresholds being dependent upon the amount of current through the resistor; and
   output means, coupled to the threshold means, for switching between first and second output signal levels in response to the threshold circuit such that the output means switches to the first output signal level when voltage above the high threshold is applied to the emitter of the first transistor and switching to the second output signal level when voltage below the low threshold is applied to the emitter of the first transistor, whereby the input buffer circuit has hysteresis, maintains substantially constant high and low thresholds independent of temperature and without requiring a temperature stable voltage supply, and has protection against negative input voltages.

* * * * *